(12) United States Patent  
Berliner et al.

(10) Patent No.: US 8,124,427 B2  
(45) Date of Patent: Feb. 28, 2012

(54) METHOD OF CREATING AN EXTREMELY THIN SEMICONDUCTOR-ON-INSULATOR (ETSOI) LAYER HAVING A UNIFORM THICKNESS

(75) Inventors: Nathaniel C. Berliner, Albany, NY (US); Kangguo Cheng, Guilderland, NY (US); Toshiharu Furukawa, Essex Junction, VT (US); Douglas C. La Tulipe, Jr., Guilderland, NY (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/603,671

(22) Filed: Oct. 22, 2009

(65) Prior Publication Data

US 2011/0097824 A1 Apr. 28, 2011

(51) Int. Cl.
- *H01L 21/66* (2006.01)
- *H01L 21/336* (2006.01)
- *H01L 21/00* (2006.01)
- *H01L 21/84* (2006.01)
- *H01L 21/31* (2006.01)

(52) U.S. Cl. ........ 438/14; 438/297; 438/149; 438/770; 438/766

(58) Field of Classification Search ............... 438/14, 438/149, 165, 297, 302, 298, 305, 306, 308, 438/369, 370, 372, 373, 491, 510, 514, 506, 438/766, 761, 770  
See application file for complete search history.

(56) References Cited

U.S. PATENT DOCUMENTS

| | | |
|---|---|---|
| 5,154,023 A | 10/1992 | Sioshansi |
| 6,229,184 B1 | 5/2001 | Riccobene |
| 6,537,606 B2 * | 3/2003 | Allen et al. .................. 427/9 |
| 6,599,840 B2 | 7/2003 | Wu et al. |
| 6,927,146 B2 | 8/2005 | Brask et al. |
| 7,087,475 B2 | 8/2006 | Inoh |
| 7,202,123 B1 | 4/2007 | Pan |
| 7,265,054 B2 | 9/2007 | Choi et al. |
| 7,320,929 B2 | 1/2008 | Aga et al. |
| 7,407,868 B2 | 8/2008 | Brask et al. |
| 7,767,583 B2 | 8/2010 | Ramappa et al. |
| 7,804,151 B2 | 9/2010 | Brown et al. |
| 2003/0235959 A1 | 12/2003 | Lichtenberger et al. |
| 2007/0145481 A1 * | 6/2007 | Tilke et al. ................ 257/347 |
| 2007/0277874 A1 | 12/2007 | Dawson-Elli et al. |
| 2007/0281105 A1 * | 12/2007 | Mokhlesi et al. ........... 427/569 |
| 2008/0299686 A1 | 12/2008 | Kobayashi et al. |
| 2011/0095366 A1 | 4/2011 | Abadeer et al. |
| 2011/0095393 A1 | 4/2011 | Berliner et al. |

OTHER PUBLICATIONS

Office Action dated Dec. 23, 2010 in U.S. Appl. No. 12/603,668.  
Office Action dated Jan. 6, 2011 in U.S. Appl. No. 12/603,737.  
Allen et al., SOI Uniformity and Surface Smoothness Improvement Using GCIB Processing, 2002 IEEE International SOI Conference, Oct. 2002, pp. 192-193.  
Eryu, et al., "Nanostructure Formation of SiC Using Ion Implantation and CMP", Nuclear Instruments and Methods in Physics Research, B 242, 2006, pp. 237-239.  
Final Office Action dated Jun. 27, 2011 in U.S. Appl. No. 12/603,668.  
Final Office Action dated Jul. 12, 2011 in U.S. Appl. No. 12/603,737.  
Notice of Allowance dated Oct. 5, 2011 in U.S. Appl. No. 12/603,737.

\* cited by examiner

*Primary Examiner* — Chuong A. Luu  
(74) *Attorney, Agent, or Firm* — Richard Kotulak; Roberts Mlotkowski Safran & Cole, P.C.

(57) ABSTRACT

A method for creating an extremely thin semiconductor-on-insulator (ETSOI) layer having a uniform thickness includes: measuring a thickness of a semiconductor-on-insulator (SOI) layer at a plurality of locations; determining a removal thickness at each of the plurality of locations; and implanting ions at the plurality of locations. The implanting is dynamically based on the removal thickness at each of the plurality of locations. The method further includes oxidizing the SOI layer to form an oxide layer, and removing the oxide layer.

20 Claims, 5 Drawing Sheets

METHOD OF CREATING AN EXTREMELY THIN SEMICONDUCTOR-ON-INSULATOR (ETSOI) LAYER HAVING A UNIFORM THICKNESS

FIELD OF THE INVENTION

The invention generally relates to the fabrication of semiconductor wafers and, more particularly, to a method for creating an extremely thin semiconductor-on-insulator (ETSOI) layer having a uniform thickness.

BACKGROUND

Complementary metal oxide semiconductor (CMOS) devices built on an extremely thin semiconductor-on-insulator (SOI) substrate has been one of the viable options for continued scaling of CMOS technology to 22 nm node and beyond. For viable use in the 22 nm node, ETSOI wafers require an extremely thin SOI layer having a thickness of about 60 Angstroms (Å) or less with a variation in the thickness of about +/−6 Å or less. The electrical characteristics of devices formed using ETSOI technology are influenced by the thickness of the ETSOI layer. For example, the threshold voltage (Vt) of a device formed using ETSOI is primarily determined by the thickness of the ETSOI layer. As such, any variation in the thickness of an ETSOI layer of wafer can lead to undesirable variations in threshold voltage. For example, when many chips are created from a 300 mm ETSOI wafer, variations in the thickness of the ETSOI layer can result in threshold voltage variation from chip to chip, or within a single chip.

Wafer thinning is a known technique for creating an ETSOI wafer from an SOI wafer. However, conventional wafer thinning processes produce an ETSOI layer with too much within-a-wafer thickness variation for the desired 22 nm node. For example, a known wafer thinning technique is to oxidize a bonded or SIMOX (e.g., separated by ion implantation of oxygen) SOI wafer in a furnace and then wet etch the oxide. However, this method does not improve SOI layer thickness variation, but rather simply transfers any thickness variation that is initially present in the SOI layer to the ETSOI layer. For example, known oxidation-based wafer thinning techniques are capable of producing an ETSOI layer having a thickness of about 60 Å, but with a thickness variation of about +/−20 Å. As such, conventional wafer thinning techniques do not provide the ETSOI layer thickness uniformity required by the 22 nm node.

Corrective etching is another known wafer thinning technique that utilizes gas cluster ion beam (GCIB) etching to thin the SOI layer of a wafer. Corrective etching is capable of thinning an SOI layer to a thickness of less than 60 Å with a thickness variation of less than +/−6 Å. However, GCIB etching produces high energy chemical and physical reactions at the surface of the wafer, and these reactions leave undesirable surface damage on portions of the wafer that remain after the etch is complete.

Accordingly, there exists a need in the art to overcome the deficiencies and limitations described hereinabove.

SUMMARY

In a first aspect of the invention, a method comprises: measuring a thickness of a semiconductor-on-insulator (SOI) layer at a plurality of locations; determining a removal thickness at each of the plurality of locations; and implanting ions at the plurality of locations. The implanting is dynamically based on the removal thickness at each of the plurality of locations. The method further includes oxidizing the SOI layer to form an oxide layer, and removing the oxide layer.

In another aspect of the invention, there is a method comprising: measuring a thickness of an SOI layer at a plurality of locations; forming an oxide layer having in the SOI layer, wherein a thickness of the oxide layer varies based on the thickness of the SOI layer at the plurality of locations; and removing the oxide layer. After the removing, a remaining portion of the SOI layer forms an ETSOI layer.

In another aspect of the invention, a system comprises: a measuring device configured to measure thickness of an SOI layer at a plurality of locations; a processor configured to determine a removal thickness at each of the a plurality of locations; and an ion implant device configured to implant a species into the SOI layer at each of the plurality of locations. At least one of implantation dose and implantation energy is adjusted based on the removal thickness at each of the plurality of locations. The system also includes an oxidation system configured to oxidize the SOI layer to form an oxide layer, and an oxide removal system configured to remove the oxide layer.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention generally relates to the fabrication of semiconductor wafers and, more particularly, to a method for creating an extremely thin semiconductor-on-insulator (ETSOI) layer having a uniform thickness. In accordance with aspects of the invention, the thickness of the SOI layer of a starting wafer is measured at a plurality of locations on the wafer. In embodiments, the measurements are used to determine a removal thickness at each respective location, e.g., an amount of the SOI layer to be removed at the location in order to create a substantially uniform ETSOI layer. In embodiments, a dynamic ion implantation is performed at variable dosage and/or energy in the SOI layer based on the removal thickness of the respective locations. The wafer is then oxidized to form oxide of varying thickness, and the oxide is etched. The resulting wafer has an ETSOI layer that is sufficiently thin and uniform for the 22 nm node, e.g., has a thickness of less than about 60 Å and a thickness variation of less than about +/−6 Å across the wafer. In this manner, implementations of the invention may be used to fabricate ETSOI wafers for use with the 22 nm node.

Figure 1:
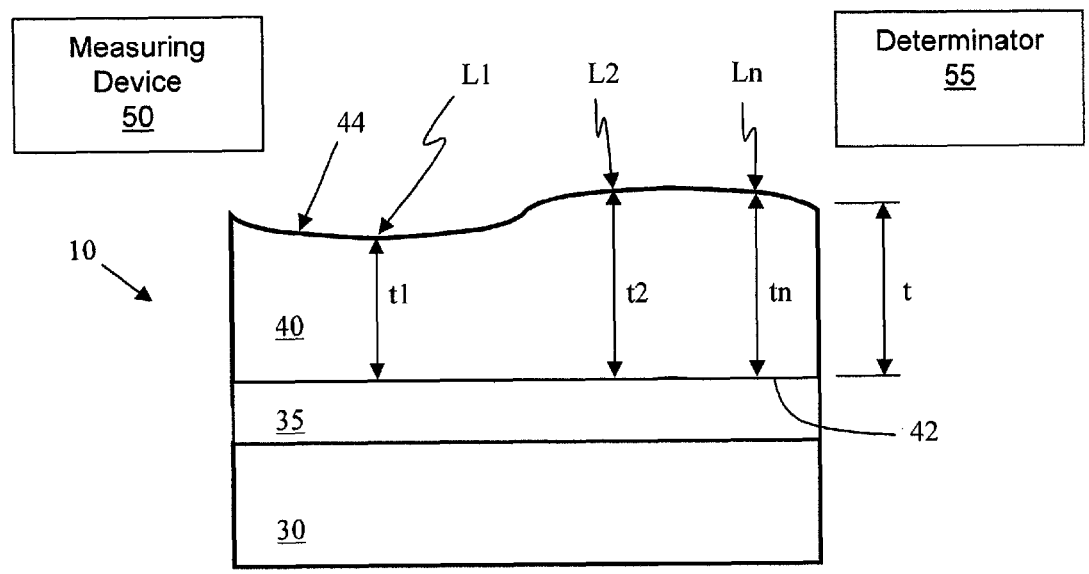
FIG. 1 shows a semiconductor structure and process in accordance with aspects of the invention.

FIG. 1 shows a semiconductor structure and process in accordance with aspects of the invention. More specifically, FIG. 1 shows a wafer 10 comprising a substrate 30, an insulator layer 35 formed on the substrate 30, and a semiconductor-on-insulator (SOI) layer 40 formed on the insulator layer 35. In embodiments, the substrate 30 and/or SOI layer 40 may be composed of any suitable semiconductor material, such as, for example, silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable materials include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire layer may be strained. Moreover, the wafer 10 may be formed using conventional semiconductor fabrication techniques, including but not limited to bonded SOI, SIMOX, etc. However, the wafer 10 is not limited to an SOI wafer, and the teachings of the invention are applicable to any desired wafer, such as a bulk semiconductor wafer. Additionally, the insulator layer 40 may be composed of any suitable insulator (e.g., dielectric) material, such as, for example, silicon dioxide ($SiO_2$). For example, the insulator layer 40 may constitute a buried oxide (BOX) layer.

As depicted in FIG. 1, the SOI layer 40 has a nominal (e.g., average) thickness "t" which constitutes a distance from an interface 42 between the insulator layer 35 and the SOI layer 40 to a top 44 of the SOI layer 40 measured along a line that is substantially orthogonal to the interface 42. As further shown in FIG. 1, the SOI layer 40 has different thicknesses, e.g., t1, t2, ..., tn, at different locations, e.g., L1, L2, ..., Ln, as a result of the SOI fabrication process used to create the wafer 10. For example, a wafer made using conventional processing techniques may have an SOI layer with a nominal thickness in the range of about 300 Å to about 500 Å. Moreover, such an SOI layer may have a thickness variation (e.g., a deviation from the nominal thickness at any particular location) of about +/−45 Å, and may even be as high as about +/−55 Å. However, the invention is not limited to a wafer having an SOI layer 40 with these dimensions. Instead, an SOI layer 40 having any desired thickness and thickness variation may be used within the scope of the invention.

In accordance with aspects of the invention, a measuring device 50 is used to measure the thickness of the SOI layer 40 at a plurality of locations L1, L2, ..., Ln. The measuring device 50 may comprise any known or later-developed measuring system that is capable of measuring the thickness of the SOI layer 40. For example, the measuring device 50 may comprise an interferometer or an interferometry-based device. Additionally or alternatively, when the spatial location of the interface 42 is known, the thickness of the SOI layer 40 may be measured (e.g., determined) using an atomic level topography measuring device, such as a scanning electron microscope (SEM) or atomic force microscope (AFM), applied to the top surface 44 of the SOI layer 40.

In embodiments, the measured thickness at a particular location of the SOI layer 40 is used to determine a removal thickness at that location, e.g., how much of the SOI layer 40 will later be removed from that location to produce an ETSOI layer having a predetermined final thickness. More specifically, the removal thickness at any location of the SOI layer 40 may be determined as the difference between the measured thickness at that location and the desired final thickness of the resultant ETSOI layer.

Figure 2:
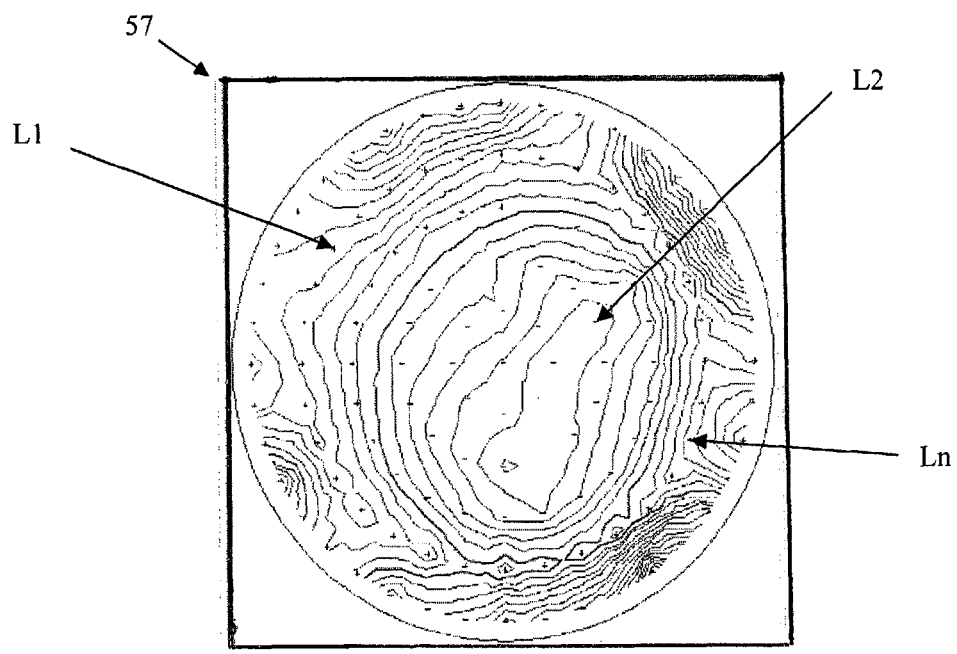
FIG. 2 shows a topographical map of a semiconductor structure in accordance with aspects of the invention.

For example, in the wafer 10 shown in FIG. 1, location L1 may have a measured thickness t1 of 280 Å and location L2 may have a measured thickness t2 of 325 Å. Moreover, the desired final thickness of the ETSOI layer may be 60 Å. Therefore, the removal thickness at location L1 is 220 Å (e.g., 280 minus 60), and the removal thickness at location L2 is 265 Å (e.g., 325 minus 60). It is noted that these exemplary values are provided for illustration purposes only, the invention is not limited to these thickness values, and any suitable thickness values may be used within the scope of the invention. In embodiments, a determinator 55, described in greater detail below, may be used to determine the removal thickness at each of the plurality of locations L1, L2, ..., Ln of the SOI layer 40 based on the values of measured thickness t1, t2, ..., tn. In further embodiments, the measured thickness and/or the determined removal thickness at the plurality of locations L1, L2, ..., Ln may be arranged in a topographical map 57 of the wafer 10, such as that shown in FIG. 2.

Figure 3:
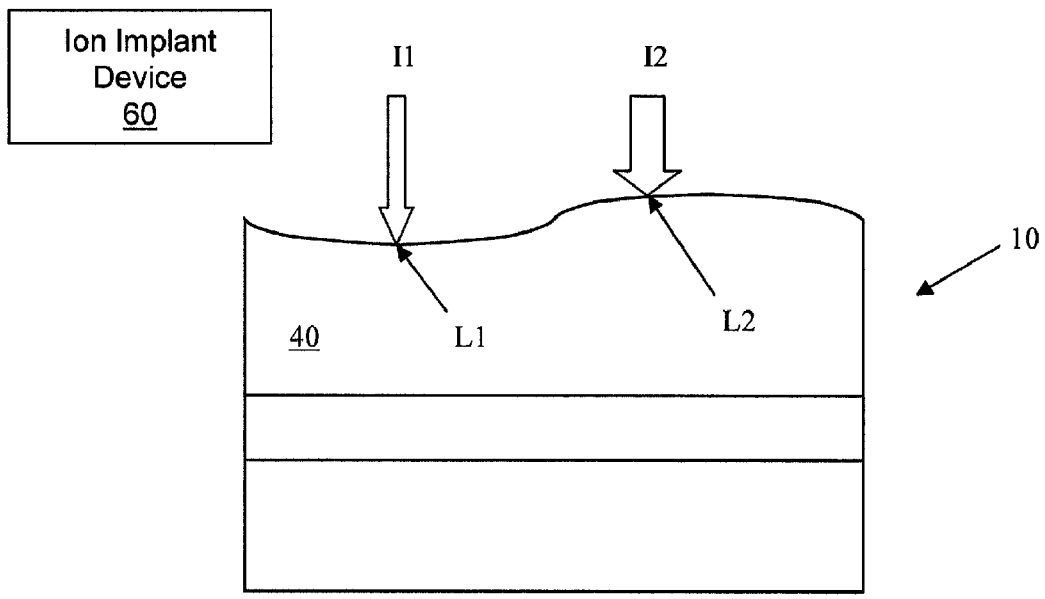
FIGS. 3-5 show semiconductor structures and processes in accordance with aspects of the invention.

FIG. 3 shows a dynamic ion implantation step applied to the SOI layer 40 of the wafer 10 in accordance with aspects of the invention. In embodiments, an ion implant device 60 is used to dynamically implant ions in the SOI layer 40 based on the respective determined removal thickness at the plurality of locations of the SOI layer 40. More specifically, based upon the determined removal thickness at a particular location of the SOI layer 40, the ion implant device 60 dynamically adjusts at least one of the implantation dose (e.g., scan speed) and implantation energy at that particular location.

For a given implant species, the oxidation rate of a material (e.g., SOI layer 40) can be determined using conventional techniques based upon the implantation dose and implantation energy, among other factors. Therefore, in embodiments, the ion implant device 60 may be configured to implant ions at a particular dose and energy at a particular location of the SOI layer 40 in order to achieve a desired oxidation rate at that location. When the wafer 10 is later oxidized, a known amount (e.g., thickness) of oxide is formed at that particular location based upon the oxidation rate that is defined by the ion implantation dose and implantation energy at that location. By dynamically adjusting the ion implantation dose and/or energy at each of the plurality of locations based on the determined removal thickness for each location, implementations of the invention may be used to achieve different oxidation rates (and, therefore, different oxide thicknesses) at the various locations L1, L2, ..., Ln of the SOI layer 40.

The dynamic adjustment of the ion implantation of the SOI layer 40 is illustrated in FIG. 3. In embodiments, the ion implant device 60 adjusts the implantation dose and/or energy to perform an ion implant I1 at location L1 that will provide a particular oxidation rate at location L1 based on the determined removal thickness for the location L1. The implantation dose and/or energy are chosen so that, when the wafer 10 is later oxidized, an amount (e.g., thickness) of oxide formed at location L1 substantially equals the determined removal thickness for location L1. When the ion implant device moves to location L2, the ion implant device 60 adjusts the implantation dose and/or energy to perform an ion implant I2 that will provide a particular oxidation rate at location L2 based on the determined removal thickness for the location L2. The implantation dose and/or energy are chosen so that, when the wafer 10 is later oxidized, as amount (e.g., thickness) of oxide formed at location L2 substantially equals the determined removal thickness for location L2.

The ion implant device 60 may be any conventional or later developed ion implant system that is capable of dynamically adjusting the implantation dose and/or energy from one location to another during an implantation process. The ion implant device 60 may comprise, for example, a beam implanter in which the beam is rastered across the wafer 10 by moving the beam relative to the wafer 10 and/or by moving the wafer relative to the beam 10. In embodiments, the ion implant device 60 has an adjustable dwell time. Moreover, the ion implant device 60 may be configured for continuous movement, or may employ a pulsed system. For example, a pulsed system may be employed with discrete areas (e.g., limited by beam spot size) with overlapping areas to achieve desired implant depth/dose profiles. For example, a spot beam implanter may be provided with a control system that operates to adjust energy and recheck beam currents while the wafer is not exposed, and then move to the desired wafer location and pulse to achieve the desired dose. Additionally, the ion implant device 60 may be configured to deliver the beam at any desired beam angle, including but not limited to orthogonal to the wafer or angled with respect to the wafer.

In embodiments, the ion implant device 60 implants into the SOI layer 40 a species which may include, for example, boron (B), carbon (C), oxygen (O), nitrogen (N), fluorine (F), xenon (Xe), Argon (Ar), Silicon (Si), and Germanium (Ge). However, the invention is not limited to these species, and any suitable species that achieves a desired local oxidation rate in the SOI layer 40 may be used within the scope of the invention.

In accordance with further aspects of the invention, to amorphize single-crystal silicon in the SOI layer 40, the ions implanted by the ion implant device 60 may be any ion (e.g., species) that is capable of rendering the semiconductor substrate amorphous. Examples of such amorphizing ions include, but are not limited to, argon, krypton, neon, helium, boron, indium, thallium, carbon, silicon, germanium, nitrogen, phosphorus, arsenic, sulfur, iodine, oxygen, boron fluoride, or any combination of these ions.

Any suitable implantation dose and implantation energy levels may be used within the scope of the invention. For example, depending on the implanted ions and the implantation angle, the ion implant device 60 may use an implant energy within a range from about 0.2 keV to about 800 keV, with a preferred range being from about 10 keV to about 200 keV, and a most preferred range being from about 30 keV to about 60 keV. The dose of the amorphizing ions being implanted may vary depending on the type of amorphized ion being implanted. Typically, the dose of the implanted amorphizing ion is from about $1 \times 10^{13}$ atoms/cm$^2$ to about $5 \times 10^{15}$ atoms/cm$^2$, with a dose from about $5 \times 10^{13}$ atoms/cm$^2$ to about $1 \times 10^{15}$ atoms/cm$^2$ being even more typical. An exemplary ion implantation to amorphize single-crystal silicon includes an ion implantation of Xe, with dose of about $3 \times 10^{14}$ atoms/cm$^2$ and an energy of about 20 keV. However, the invention is not limited to these exemplary implantation dose and implantation energy values, and other dose and energy values are contemplated for use with the invention.

Moreover, the invention is not limited to implant species that amorphize silicon in the SOI layer 40. Instead, the ion implant device 60 may be used to implant any desired species, including a non-amorphizing species, which achieves a desired oxidation rate in the SOI layer 40.

Figure 4:
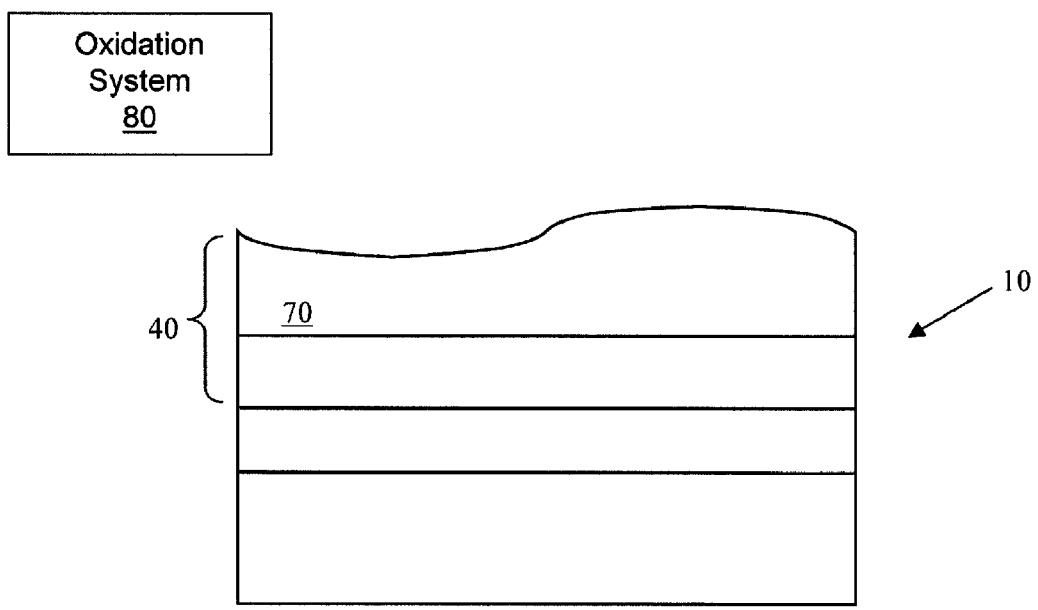

As depicted in FIG. 4, an oxidation system 80 oxidizes the ion-implanted SOI layer 40 of the wafer 10 to form an oxide layer 70. In accordance with aspects of the invention, the oxide layer 70 has a variable thickness. More specifically, the thickness of the oxide layer 70 at any particular location is substantially equal to the removal thickness at that location. In embodiments, the oxidation system 80 comprises a furnace in which the oxidation is performed at a temperature ranging from about 850° C. to 1050° C. for a time period ranging from about 5 minutes to 100 minutes. Alternatively, the oxidation system 80 comprises a rapid thermal processing (RTP) system in which the oxidation is performed at a temperature at a temperature ranging from about 900° C. to 1200° C. for a time period ranging from about 1 seconds to 3 minutes. However, the invention is not limited to this exemplary oxidation system and process, and any suitable dry oxidation or wet oxidation may be used within the scope of the invention.

Figure 5:
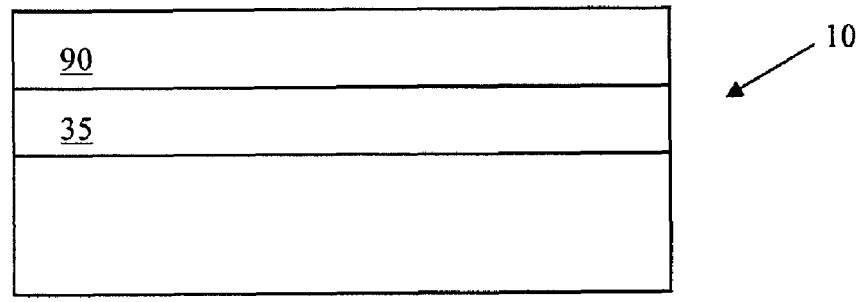

As depicted in FIG. 5, an oxide removal system 100 removes the oxide layer 70 from the wafer, leaving an ETSOI layer 90 atop the insulator layer 35 of the wafer 10. In embodiments, the oxide removal system 100 comprises a wet etch system, such as a bath of hydrofluoric acid. However, any conventional oxide removal system and process may be used to remove the oxide within the scope of the invention.

Figure 6:
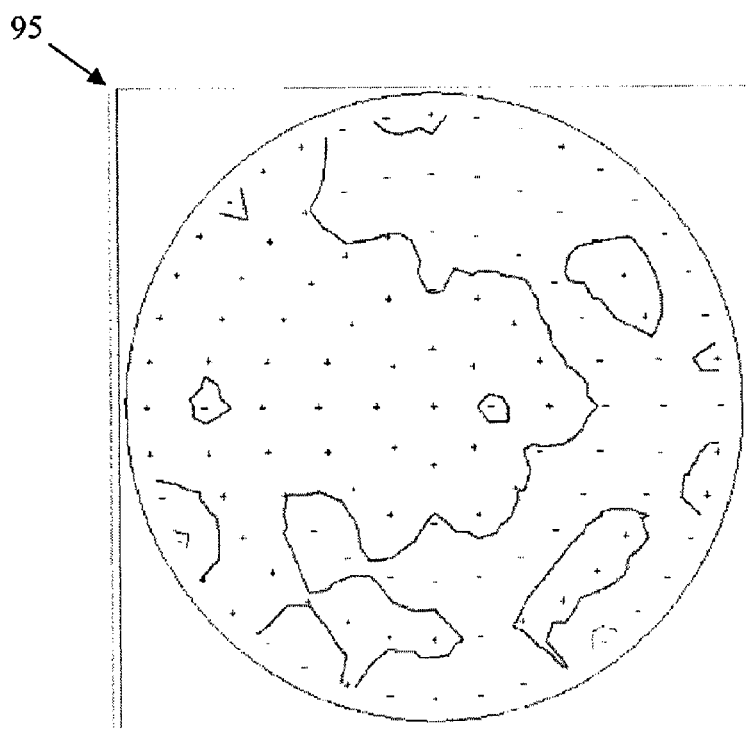
FIG. 6 shows a topographical map of a semiconductor structure in accordance with aspects of the invention.

In embodiments, the ETSOI layer 90 has a thickness of about 60 Å or less, and preferably about 40 Å or less. Moreover, the ETSOI layer has a thickness variation of about +/−6 Å or less, and preferably about +/−4 Å or less. The invention is not limited to these exemplary values of thickness and thickness variation. Instead, any suitable values of thickness and thickness variation may be used within the scope of the invention. FIG. 6 shows a topographical map 95 of the surface of the ETOSI layer 90. The thickness variation across the ETSOI layer 90 of the wafer 10 is substantially uniform compared to that shown in FIG. 2 in association with the SOI layer 40.

Figure 7:
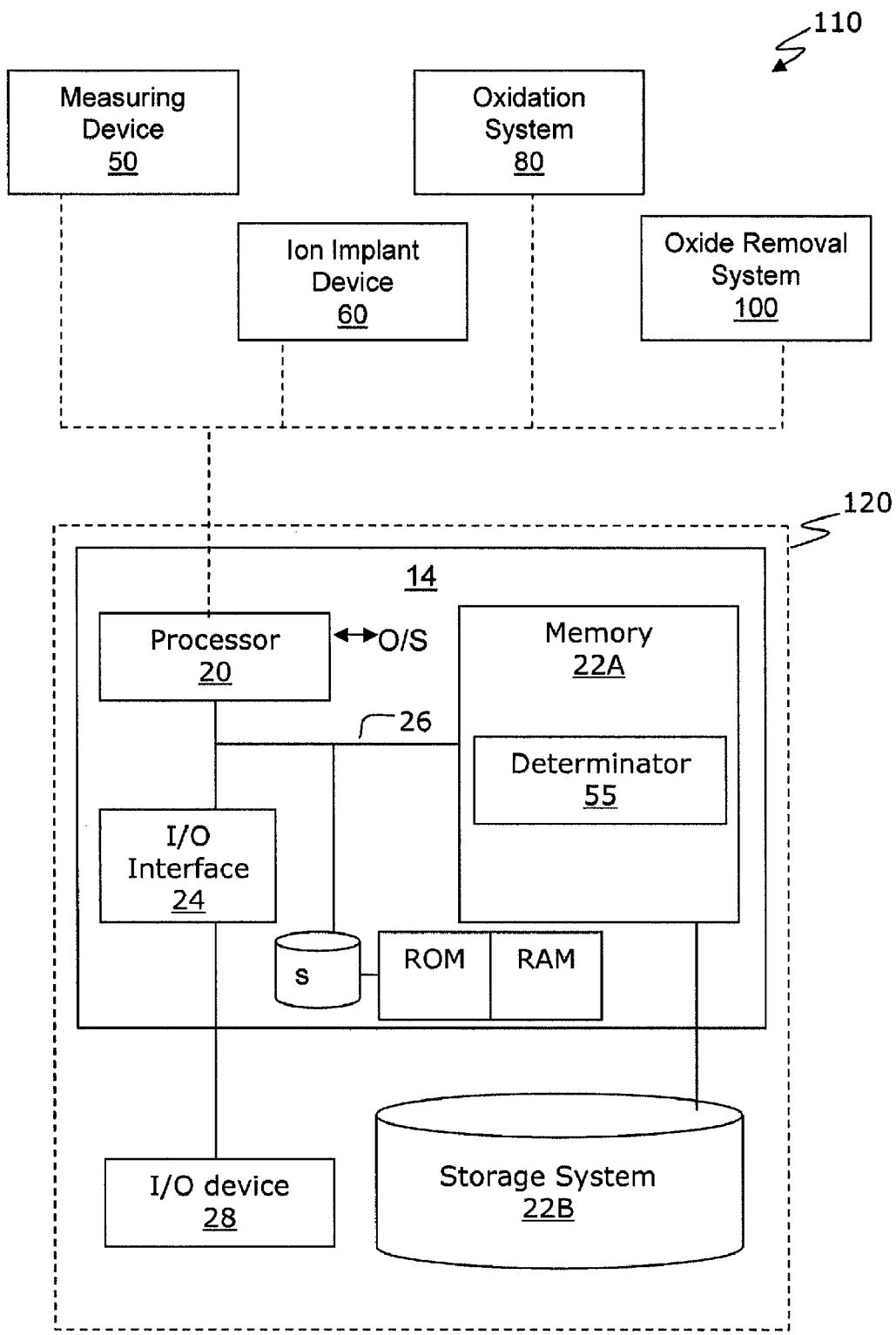
FIG. 7 shows a system in accordance with aspects of the invention.

FIG. 7 shows a system 110 in accordance with aspects of the invention. In embodiments, the system 110 includes the measuring device 50, determinator 55, ion implant device 60, oxidation system 80, and oxide removal system 100, all of which have been described herein. In embodiments, the system 110 may further comprise a controller 120 that comprises and/or is operatively connected to at least one of the measuring device 50, determinator 55, ion implant device 60, oxidation system 80, and oxide removal system 100.

As will be appreciated by one skilled in the art, the controller 120 may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following:
- a portable computer diskette,
- a hard disk,
- a random access memory (RAM),
- a read-only memory (ROM),
- an erasable programmable read-only memory (EPROM or Flash memory),
- a portable compact disc read-only memory (CDROM), and/or
- an optical storage device.

The computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

In the context of this document, a computer-usable or computer-readable medium may be any medium that can contain, store, communicate, propagate, or transport the program for use by or in connection with the instruction execution system, apparatus, or device. The computer usable program code may be transmitted using any appropriate transmission media via a network.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network. This may include, for example, a local area network (LAN) or a wide area network (WAN), or the connection may be made to an external computer (for example, through the Internet using an Internet Service Provider).

In embodiments, the controller 120 may comprise a computing device 14 that includes a processor 20, a memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and a CPU.

In general, the processor 20 executes computer program code, which is stored in the memory 22A and/or storage system 22B. For example, the determinator 55 may be embodied as a special-purpose computer program code (e.g., a particular software application) that is executed by the processor 20. While executing the computer program code, the processor 20 can read and/or write data to/from memory 22A, storage system 22B, and/or I/O interface 24. The program code executes the processes of the invention. The bus 26 provides a communications link between each of the components in the computing device 14. In embodiments, the computing device 14 communicates with at least one of the measuring device 50, ion implant device 60, oxidation system 80, and oxide removal system 100 to perform the process of the invention.

The computing device 14 can comprise any general purpose computing article of manufacture capable of executing computer program code installed thereon (e.g., a personal computer, server, etc.). However, it is understood that the computing device 14 is only representative of various possible equivalent-computing devices that may perform the processes described herein. To this extent, in embodiments, the functionality provided by the computing device 14 can be implemented by a computing article of manufacture that includes any combination of general and/or specific purpose hardware and/or computer program code. In each embodiment, the program code and hardware can be created using standard programming and engineering techniques, respectively.

Figure 8:
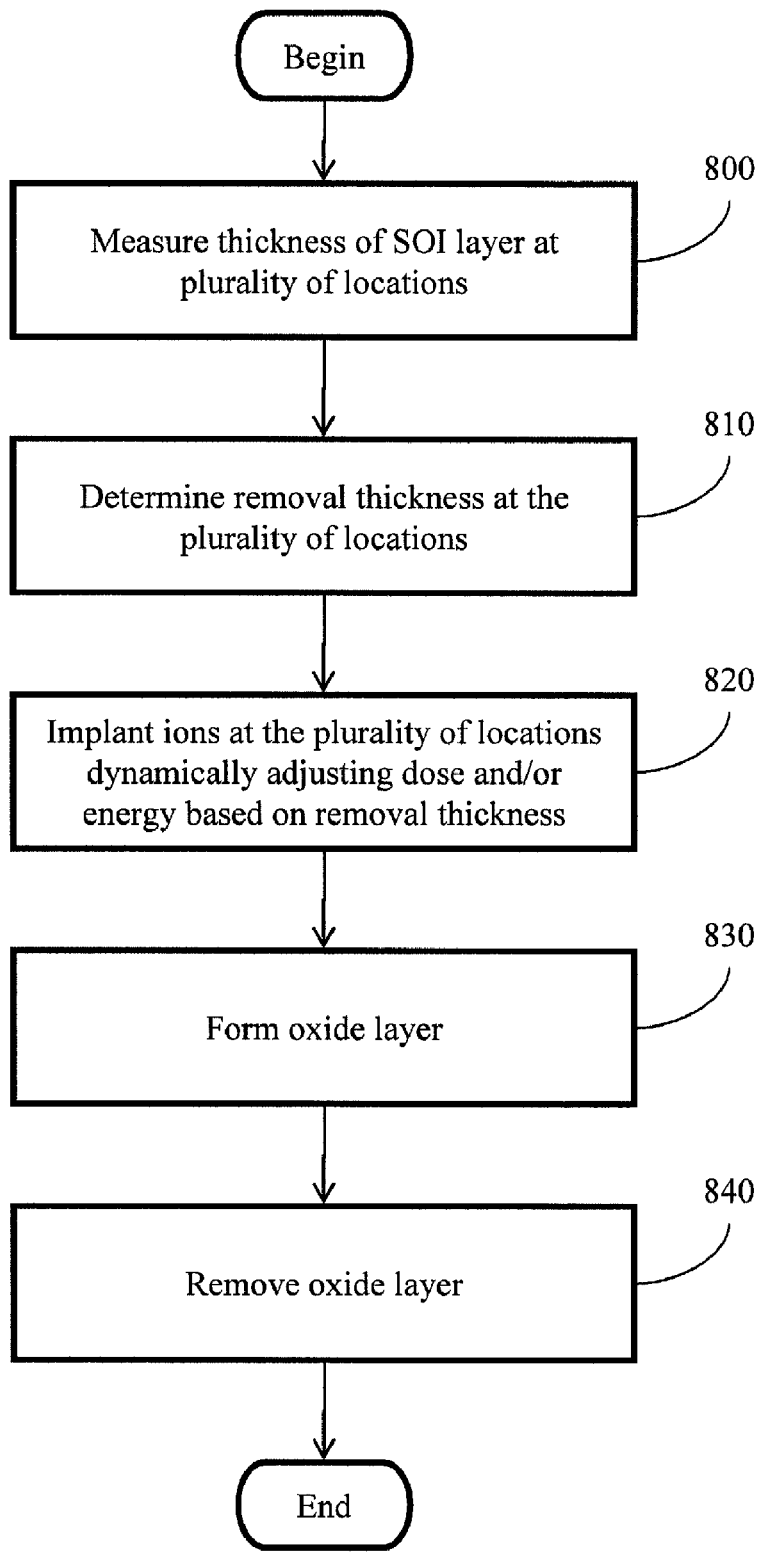
FIG. 8 shows a flow diagram of a method in accordance with aspects of the invention.

FIG. 8 illustrates exemplary processes in accordance with the present invention. The steps of FIG. 8 may be implemented on the system of FIG. 7, for example. The flow diagram in FIG. 8 may be illustrative of the architecture, functionality, and operation of possible implementations of systems, methods and computer program products according to various embodiments of the present invention. In this regard, each process may represent a module, segment, or portion of code, which comprises one or more executable instructions for implementing the specified logical function(s), e.g., of at least one of the measuring device 50, determinator 55, ion implant device 60, oxidation system 80, and oxide removal system 100. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Each block of the flow diagrams, and combinations of the flow diagrams illustrations can be implemented by special purpose hardware-based systems that perform the specified functions or acts, or combinations of special purpose hardware and computer instructions and/or software, as described above.

Additionally, the invention can take the form of an entirely hardware embodiment, an entirely software embodiment or an embodiment containing both hardware and software elements. Software includes but is not limited to firmware, resident software, microcode, etc. Furthermore, the invention can take the form of a computer program product accessible from a computer-usable or computer-readable medium providing program code for use by or in connection with a computer or any instruction execution system. The software and/or computer program product can be implemented in the system of FIG. 7. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

Referring to FIG. 8, at step 800, the thickness of an SOI layer of a wafer is measured at a plurality of locations. In embodiments, this is performed using a measuring device (e.g., measuring device 50) as described above with respect to FIGS. 1 and 7.

At step 810, a removal thickness is determined at each of the locations where thickness was measured in step 800. In embodiments, this is accomplished using a determinator (e.g., determinator 55) as described above with respect to FIGS. 1 and 7.

At step 820, an ion implant device implants ions at the plurality of locations. The ion implant device dynamically adjusts at least one of the implantation dose and implantation energy at a location based on the determined removal thickness for the location. In embodiments, this is accomplished using an ion implant device 60 as described above with respect to FIGS. 3 and 7.

At step 830, the SOI layer is oxidized to form an oxide layer of varying thickness. In embodiments, this is accomplished using an oxidation system 80 as described above with respect to FIGS. 4 and 7.

At step 840, the oxide layer is removed to produce an ETSOI layer of substantially uniform thickness. In embodiments, this is accomplished using an oxide removal system 100 as described above with respect to FIGS. 5 and 7.

The methods as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, where applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method, comprising:
   measuring a thickness of a semiconductor-on-insulator (SOI) layer at a plurality of locations;
   determining a removal thickness at each of the plurality of locations;
   implanting ions at the plurality of locations, wherein the implanting is dynamically based on the removal thickness at each of the plurality of locations;
   oxidizing the SOI layer to form an oxide layer; and
   removing the oxide layer.

2. The method of claim 1, wherein:
   the oxide layer at a first location of the plurality of locations has a first thickness, and
   the oxide layer at a second location of the plurality of locations has a second thickness different than the first thickness.

3. The method of claim 2, wherein:
   the first thickness corresponds to a first determined removal thickness, and
   the second thickness corresponds to a second determined removal thickness.

4. The method of claim 1, wherein the measuring comprises measuring a distance from an interface between the SOI layer and a buried insulator layer and a top of the SOI layer.

5. The method of claim 1, wherein the removal thickness at one of the plurality of locations is determined based on a difference between the measured thickness at the one of the plurality of locations and a final thickness of an extremely thin semiconductor on insulator (ETSOI) layer.

6. The method of claim 5, wherein the final thickness is a predetermined desired thickness of the ETSOI layer.

7. The method of claim 1, further comprising changing at least one of implantation dose and implantation energy between a first location of the plurality of locations and a second location of the plurality of locations.

8. The method of claim 7, wherein the changing at least one of the implantation dose and implantation energy causes the second location to have a second oxidation rate different than a first oxidation rate at the first location.

9. The method of claim 7, wherein the changing at least one of the implantation dose and implantation energy comprises changing a scan speed of an ion implant device.

10. The method of claim 7, wherein the changing at least one of the implantation dose and implantation energy is based on a first determined removal thickness and a second determined removal thickness.

11. The method of claim 1, wherein the oxidizing comprises oxidizing the SOI layer in a furnace.

12. The method of claim 1, wherein the removing the oxide layer comprises wet etching the oxide layer.

13. The method of claim 1, wherein the removing the oxide layer results in an ETSOI layer atop an insulator layer.

14. The method of claim 13, wherein the ETSOI layer has an average thickness of less than or equal to about 60 Å.

15. The method of claim 14, wherein the ETSOI layer has a thickness variation of less than about +/−6 Å.

16. A method, comprising:
    measuring a thickness of an SOI layer at a plurality of locations;
    forming an oxide layer in the SOI layer, wherein a thickness of the oxide layer varies based on the thickness of the SOI layer at the plurality of locations; and
    removing the oxide layer, wherein after the removing a remaining portion of the SOI layer forms an ETSOI layer.

17. The method of claim 16, wherein the forming comprises:
    implanting ions into the SOI layer, wherein the implanting comprises dynamically adjusting at least one of implantation dose and implantation energy at the plurality of locations based on the thickness of the SOI layer at the plurality of locations; and
    oxidizing the SOI layer in a furnace.

18. The method of claim 17, wherein:
   the ETSOI layer has an average thickness of less than or equal to about 60 Å, and
   the ETSOI layer has a thickness variation of less than about +/−6 Å.

19. The method of claim 1, wherein the oxidizing the SOI layer forms is the oxide layer in a top portion of the SOI layer while leaving an ETSOI layer of the SOI layer at a bottom portion of the SOI layer.

20. The method of claim 19, wherein a thickness of the oxide layer at each of the plurality of locations equals a difference between a measured thickness of the SOI layer at the respective location and a desired final thickness of the ETSOI layer at the respective location.

* * * * *